(12) United States Patent
Hammond

(10) Patent No.: US 8,896,290 B2
(45) Date of Patent: Nov. 25, 2014

(54) HALL EFFECT CURRENT SENSOR FOR MEDIUM-VOLTAGE APPLICATIONS

(75) Inventor: Peter Willard Hammond, Greensburg, PA (US)

(73) Assignee: Siemens Industry, Inc., Alpharetta, GA (US)

( * ) Notice: Subject to any disclaimer, the term of this patent is extended or adjusted under 35 U.S.C. 154(b) by 298 days.

(21) Appl. No.: 13/372,927

(22) Filed: Feb. 14, 2012

(65) Prior Publication Data
US 2013/0207640 A1 Aug. 15, 2013

(51) Int. Cl.
*G01R 15/20* (2006.01)
*G01R 15/18* (2006.01)

(52) U.S. Cl.
USPC .................. 324/117 H; 324/117 R

(58) Field of Classification Search
None
See application file for complete search history.

(56) References Cited

U.S. PATENT DOCUMENTS

| | | | | |
|---|---|---|---|---|
| 3,996,510 A | * | 12/1976 | Guichard | 327/510 |
| 5,583,429 A | * | 12/1996 | Otaka | 324/127 |
| 2002/0167301 A1 | * | 11/2002 | Haensgen et al. | 324/117 H |
| 2008/0061915 A1 | * | 3/2008 | Godbey | 336/96 |
| 2009/0058412 A1 | * | 3/2009 | Taylor et al. | 324/252 |
| 2012/0038352 A1 | * | 2/2012 | Elian et al. | 324/239 |

OTHER PUBLICATIONS

ABB S.R.O., MV Instrument Transformers and Sensors, Aug. 26, 2005; (12 pages).
Honeywell, Hall Effect Sensing and Application: MICRO SWITCH Sensing and Control, Illinois, (126 pages).

* cited by examiner

*Primary Examiner* — Melissa Koval
*Assistant Examiner* — Courtney McDonnough

(57) ABSTRACT

A current sensor for measuring medium-voltage currents. The current sensor includes an input terminal configured to receive a current, an output terminal configured to transmit the current, a closed core made from a magnetic material and comprising a gap, at least one conductor operably connected to the input terminal and the output terminal and passing through the closed core, the at least one conductor sized to carry the current, and a molded case of solid dielectric material configured to encapsulate the closed core and the at least one conductor, wherein the gap and the terminals are not encapsulated by the molded case. The molded case is dimensioned such that internal and external spacings defined by the molded case are suitable for continuous operation with a medium voltage current as applied to the terminals and the at least one conductor while the core is at ground potential.

14 Claims, 9 Drawing Sheets

HALL EFFECT CURRENT SENSOR FOR MEDIUM-VOLTAGE APPLICATIONS

BACKGROUND

The present disclosure relates to a Hall Effect sensor for measuring current in medium-voltage applications. In certain embodiments, the present disclosure relates to a Hall Effect sensor for measuring current flowing from a medium-voltage variable-frequency drive to a load motor.

Power supplies configured to control a flow of energy between a first alternating current (AC) system and a second AC system are used in a variety of commercial and industrial applications. For example, a power supply is typically used in AC motor control and operation systems. Various power supplies convert energy from a first frequency and voltage to a second frequency and voltage. The first and/or the second frequency may be variable, for example from −330 Hertz to +330 Hertz, and may include a frequency of 0 Hertz, or DC.

In most power supplies, it is necessary to include devices to measure large currents in the first and/or the second AC system. These devices produce a small-scale signal which replicates the behavior of the large measured current, but is galvanically isolated from it. This isolated signal is then used for various purposes in the control circuits of the power supply. Often the current to be measured is the output current of the power supply, so that the sensor is located just before the output terminals.

For applications in which the current to be measured has a fixed frequency, or a frequency that varies over a limited range, a current transformer can often be used as the measuring device. However, standard current transformers generally cannot be used below a frequency of 25 Hertz. Custom-designed current transformers may extend the lower limit somewhat, but current transformers cannot be used for 0 Hertz, or DC.

Therefore in power supplies with a wide range of the first and/or the second frequency, it is customary to use current sensors based on Hall Effect technology instead of current transformers, Numerous suppliers offer Hall Effect current sensors for low-voltage applications. The principal market for these low-voltage sensors are variable frequency drives for AC motors operating at 1000 volts and below. This range is here designated as "low-voltage".

There is also a growing market for variable frequency drives operating above 1000 volts, typically in the range from 1000 to 69,000 volts, This range is here designated as "medium-voltage", Most commercially available Hall Effect current sensors are not sufficiently insulated for medium-voltage. A few Hail Effect current sensors are available with very large apertures, which can achieve higher levels of insulation by means of large air spacings. However, such large-aperture sensors are bulky and costly. Another disadvantage is that air tends to break down in an electric field much weaker than can be supported by many solid dielectric materials, and the break-down strength of air becomes even weaker as altitude is increased.

For these reasons, manufacturers of medium-voltage power supplies typically use conventional low-voltage Hall Effect current sensors. Because the sensor does not have sufficient insulation, a shielded medium-voltage cable is used to pass current through the low-voltage sensor. The shielded cable confines the electric field inside the cable insulating material, so that large external air spacings are not needed. However, where the shielded cable is terminated, bulky stress-cones are required. If the shielded cable is carrying the output current from the power supply, a separate termination device must be provided to receive both the shielded cable and also the user's load cables, Another drawback is that safety codes require a metal barrier between medium-voltage and low-voltage circuits, so that it is necessary to surround the low-voltage sensor with a grounded metal barrier box. Shielded cables for medium-voltage have much larger diameter than low-voltage cables of the same current capacity. Typically the largest shielded cable that will pass through the aperture of a low-voltage Hall Effect current sensor can handle only half of the current that the sensor can handle. For higher currents, two cables and a second sensor must be used, even though the first sensor alone could handle the current. These measures generally cost much more than the first Hall Effect sensor alone, and occupy a lot of space in the power supply enclosure.

FIG. 1 shows a prior art example to illustrate the drawbacks of using low-voltage Hall Effect current sensors in a medium-voltage power supply with an output current sensing circuit 100. The circuit 100 includes a metal box 102 as a barrier between the low-voltage sensing components and the medium-voltage drive components. A pair of shielded cables 104a and 104b pass through the barrier box 102, with grommets 103a, 103b, 103c, and 103d to protect the cable from the metal edges. Each of the shielded cables 104a and 104b also pass through low-voltage Hall Effect sensors 108a and 108b respectively, mounted inside the barrier box 102. The shielded cables 104a and 104b may include various insulations such as cross-linked polyethylene (XLPE). Stress cones 106a, 106b, 106c, and 106d must be installed to avoid a concentration of the electric field at the ends of the cable shields. The shields in the cables 104a and 104b must be grounded as shown at 112a. The shields in the stress cones 106a, 106b, 106c, and 106d must be grounded as shown at 112a and 112b. The barrier box 102 must be grounded as shown at 112b.

In FIG. 1 each of the shielded cables 104a and 104b are electrically connected to a medium-voltage bus bar 116 such that the high-current produced by the power supply is divided into two paths through the circuit 100. The bus bar 116 must be supported by insulating standoffs 120c and 120d. After passing through the low-voltage Hall Effect sensors 108a and 108b, and the barrier box 102, each shielded cable 104a and 104b is further electrically connected to a second bus bar 118, where cables for delivering the power to the load can be operably connected by the user. The bus bar 118 must be supported by insulating standoffs 120a and 120b.

Within barrier box 102, the Hall Effect sensors 108a and 108b are operably connected to tow-voltage control wires 110a and 110b respectively. The control wires 110a and 110b provide control power to the sensors 108a and 108b, and transfer any signals generated by the Hall Effect sensors 108a and 108b to the control circuits of the power supply. The control circuits may add the signals from sensors 108a and 108b to obtain a replica of the original current in the bus bar 116. To provide a barrier between the low-voltage control wires 110a and 110b and the medium-voltage circuits, a rigid or flexible metal conduit 114 is typically used.

In a typical motor drive or power supply, the cost of the second Hall Effect sensor, the shielded cables, the stress cones, the barrier box, the standoffs, the miscellaneous hardware, and the assembly labor can be many times greater than the cost of the first Hall Effect sensor alone. Also the volume required for the complete assembly is many times greater than the volume of the first Hall Effect sensor alone. For a multi-phase motor drive, the high-current sensing circuit 100 as shown in FIG. 1, or a similar current sensing circuit, may be duplicated for each phase, thereby further increasing the cost and size. The total volume required for all the current sensing circuits can have a significant impact on the overall size of the drive.

SUMMARY

The present disclosure is directed to an embodiment of a Hall Effect current sensor improved to measure currents in a medium-voltage power supply or motor drive, while eliminating at least some of the drawbacks of the prior art. In particular, the complexity, the volume required, and the assembly time are substantially reduced.

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this document is to be construed as an admission that the embodiments described in this document are not entitled to antedate such disclosure by virtue of prior invention. As used in this document, the term "comprising" means "including, but not limited to," and "encapsulate" means "completely surround."

In one general respect, the embodiments disclose a current sensor for measuring medium-voltage currents. The current sensor includes an input terminal configured to receive a current, an output terminal configured to transmit the current, a closed core made from a magnetic material and comprising a gap, at least one conductor operably connected to the input terminal and the output terminal and passing through the closed core, the at least one conductor sized to carry the current, and a molded case of solid dielectric material configured to encapsulate the closed core and the at least one conductor, wherein the gap, the input terminal and the output terminal are not encapsulated by the molded case. The molded case is dimensioned such that internal and external spacings defined by the molded case are suitable for co lot s operation with an AC voltage between the range of 1,000 volts and 69,000 volts as applied to the input terminal, the output terminal and the at least one conductor while the core is at ground potential.

In another general respect, the embodiments disclose a system including a power supply, a load operably connected to the power supply, and at least one current sensor positioned between the power supply and the load. The current sensor includes an input terminal configured to receive a current, an output terminal configured to transmit the current, a closed core made from a magnetic material and comprising a gap, at least one conductor operably connected to the input terminal and the output terminal and passing through the closed core, the at least one conductor sized to carry the current, and a molded case of solid dielectric material configured to encapsulate the closed core and the at least one conductor, wherein the gap, the input terminal and the output terminal are not encapsulated by the molded case. The molded case is dimensioned such that internal and external spacings defined by the molded case are suitable for continuous operation with an AC voltage between the range of 1,000 volts and 69,000 volts as applied to the input terminal, the output terminal and the at least one conductor white the core is at ground potential.

DETAILED DESCRIPTION

The present disclosure is directed to an embodiment of a Hall Effect current sensor improved to measure currents in a medium-voltage power supply or motor drive, while eliminating at least some of the drawbacks of the prior art. In particular, the complexity, the volume required, and the assembly time are substantially reduced.

Figure 2:
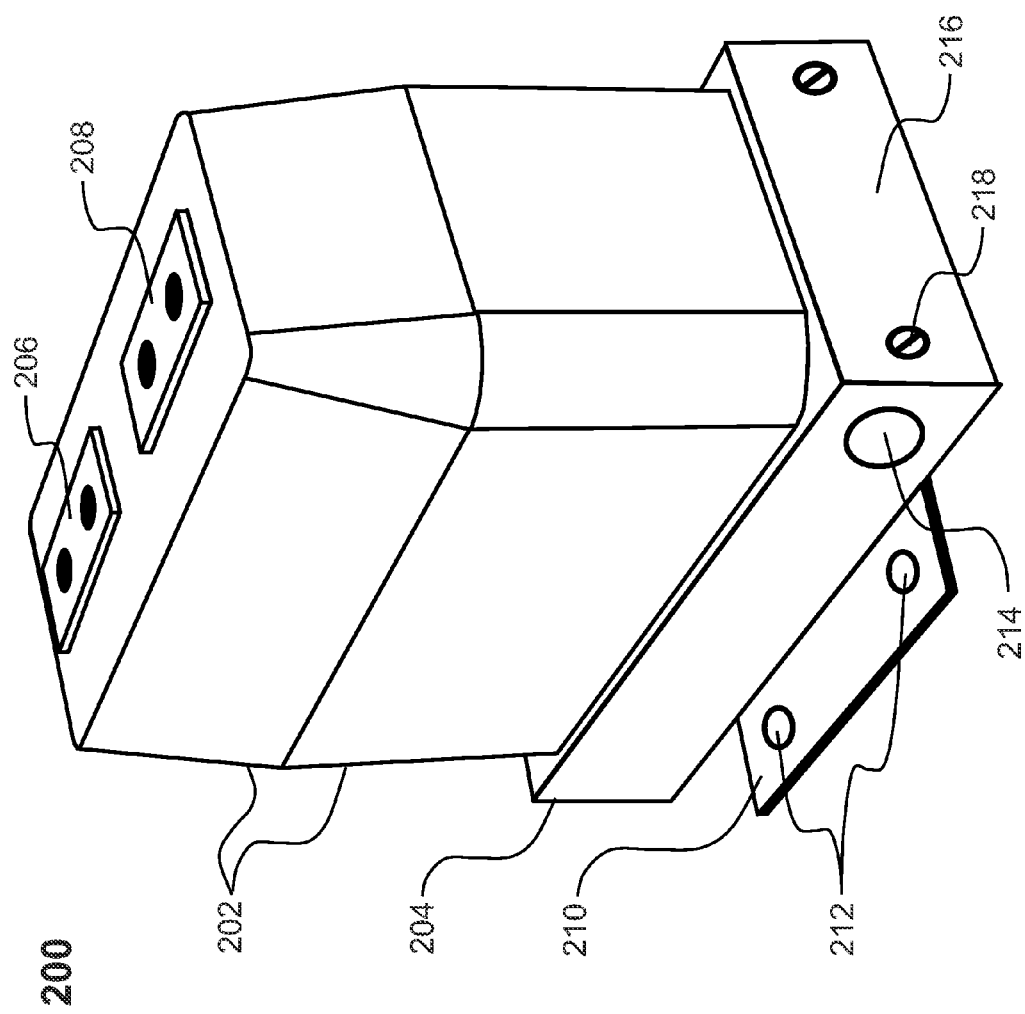
FIG. 2 illustrates a 3D view of an improved embodiment of a Hall Effect current sensor for medium-voltage applications, according to this invention.

FIG. 2 shows an illustrative embodiment of a medium-voltage Hall Effect current sensor according to this invention. The sensor 200 may be molded inside a case 202 of solid insulating material such as epoxy or polyester resin. The molding process excludes air from all regions exposed to a strong electric field, and substitutes a solid dielectric material with much better breakdown strength. The molding material for the case 202 may be poured under vacuum, to ensure that no air bubbles are entrapped. The air in such bubbles could break down during operation, and the resulting partial discharge could cause gradual degradation of the solid insulation. The case may be dimensioned so that the external spacings between the medium-voltage terminals, and the control circuits or ground, provide the clearances for strike and creep needed for medium-voltage. Inside the case the clearances can be much smaller, due to the high breakdown strength of the solid insulating material.

A high-current terminal 206 may be provided to receive the current from the power supply circuits, and a second high-current terminal 208 may be provided to deliver the current to the load after measurement. The case 202 may be mounted on top of a metal box 204, which contains a printed circuit board carrying some or all of the circuits needed for a Hall Effect current sensor. The box 204 may be equipped with two mounting flanges 210, each with mounting holes 212 (the right-hand mounting flange is not visible in FIG. 2). When the mounting flanges are bolted to a metal surface inside the power supply enclosure, the box 204 becomes grounded, and the space inside the box 204 becomes surrounded by a grounded metal barrier to separate the low-voltage circuits on the printed circuit board from any medium-voltage circuits. The height of the case 202 may be chosen to ensure that terminals 206 and 208 are spaced away from the box 204 sufficiently to provide the clearances for strike and creep needed for medium-voltage. The box 204 may be equipped with an access hole 214 suitable to attach a rigid or flexible metal conduit, as a barrier for the low voltage control wiring. A plate 216 secured by screws 218 may be temporarily removed to connect the control wiring to the printed circuit board.

Figure 1:
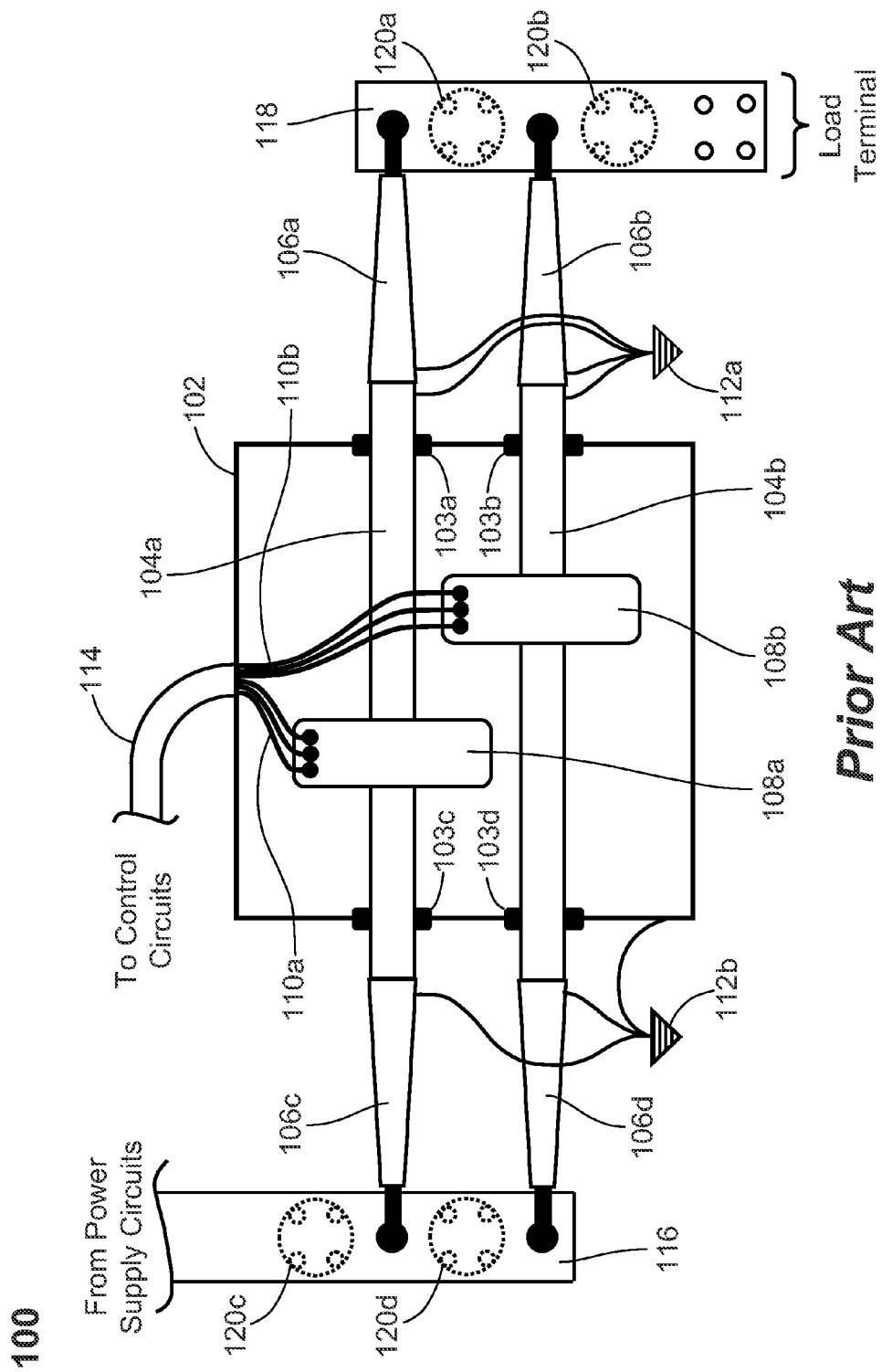
FIG. 1 illustrates a prior art example of a system to measure current in a medium-voltage circuit, while using low-voltage Hall Effect sensors.
Figure 3:
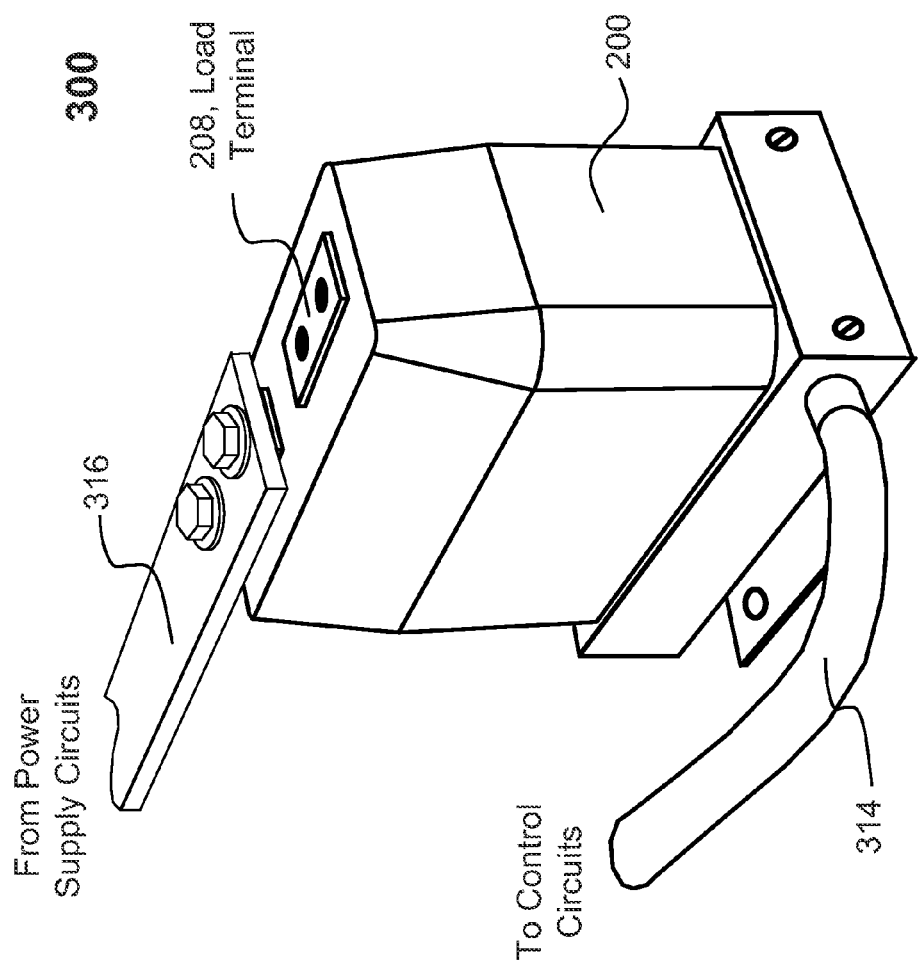
FIG. 3 illustrates how the improved embodiment of a medium-voltage Hall Effect current sensor shown in FIG. 2 could simplify the current sensing system of FIG. 1.

FIG. 3 illustrates how the prior art assembly 100 of FIG. 1 could be simplified by using the molded medium-voltage Hall Effect current sensor 200 of FIG. 2. In FIG. 3 the second Hall Effect sensor 108b, the shielded cables 104a and 104b, the stress cones 103a, 103b, 103c, and 103d, the barrier box 102, the standoffs 120a, 120b, 120c, and 120d, the miscellaneous hardware, and most of the assembly labor of FIG. 1 have been eliminated. The bus bar 116 of FIG. 1 (316 in FIG. 3) now connects directly to terminal 206. The user's load cables may be connected directly to terminal 208. The molded medium-voltage Hall Effect current sensor 200 may have enough mechanical strength to support the bus bar 316 and the load cables, without needing the standoffs 120a, 120b, 120c, and 120d of FIG. 1. The molded medium-voltage Hall Effect current sensor 200 may be slightly larger than the first low-voltage sensor 108a of FIG. 1, but the complete assembly 300 of FIG. 3 may be substantially smaller than the assembly 100 of FIG. 1.

Figure 4A:
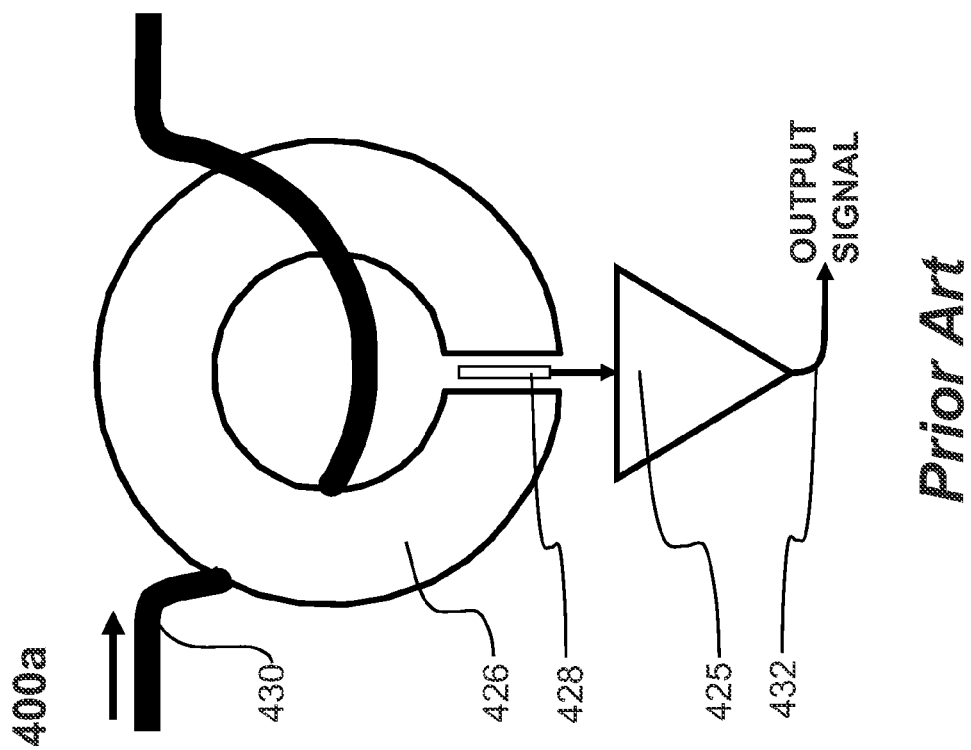
FIG. 4*a* illustrates a prior art block diagram of an open-loop Hall Effect current sensor.
Figure 4B:
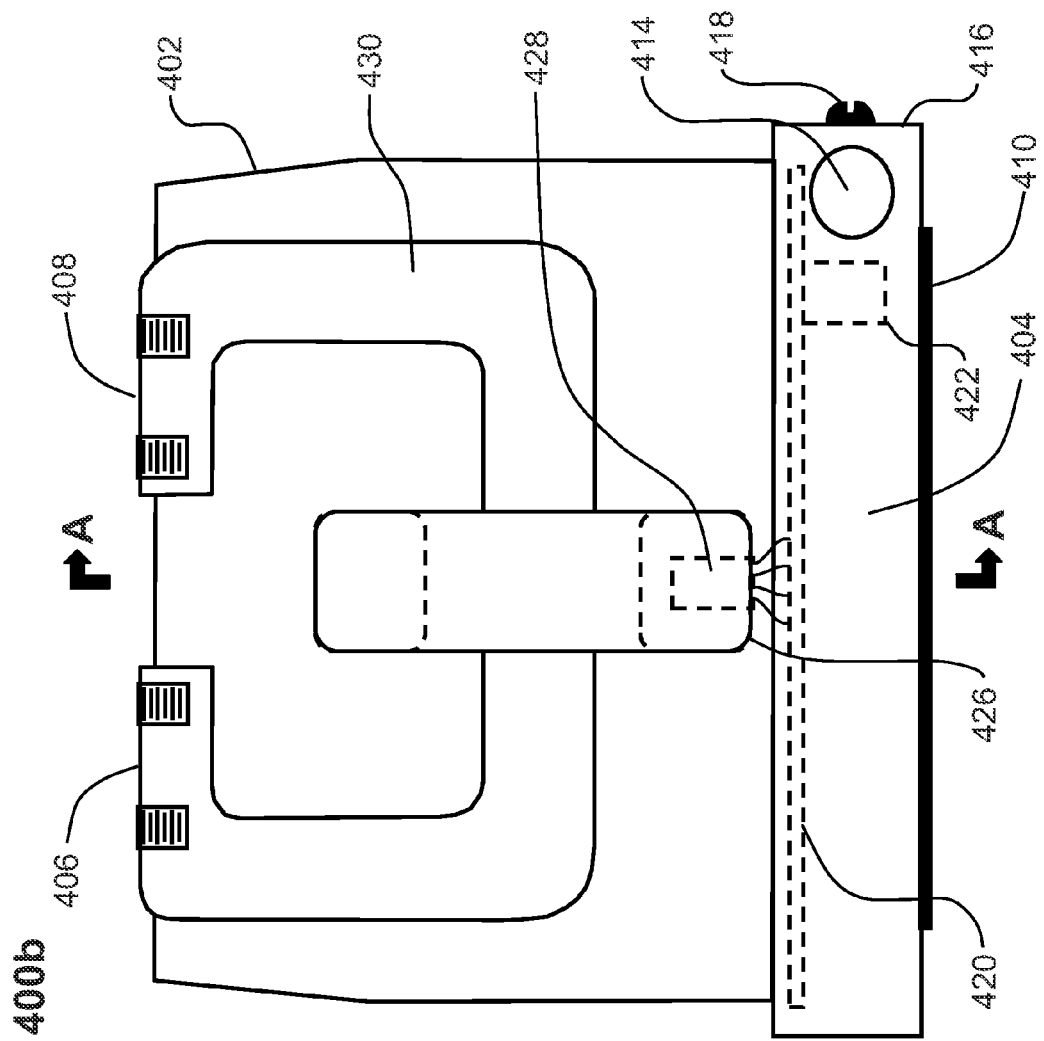
FIG. 4*b* shows an illustrative interior view showing how an open-loop Hall Effect current sensor could be implemented in the embodiment shown in FIG. 2.
Figure 4C:
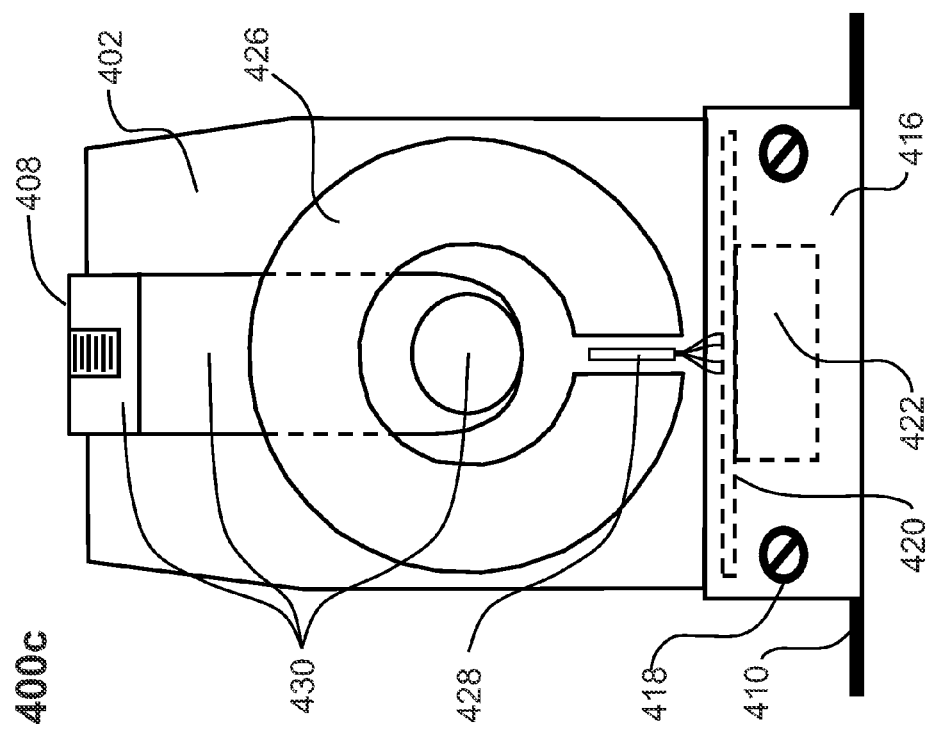
FIG. 4*c* illustrates a cross-section view of the configuration in FIG. 4*b*.

The molded medium-voltage Hall Effect current sensor 200 of FIG. 2 may be implemented with either an open-loop or a closed-loop circuit, Both circuits are well known to those of ordinary skill in the art. FIG. 4a shows a generalized prior art block diagram of an open-loop Hall Effect current sensor circuit 400b. A heavy conductor 430 carrying the current to be measured may pass through the aperture of a magnetic core 426. The core 426 may be made of any material with high relative permeability, such as steel laminations or powdered iron or ferrite. The core 426 is shown with a toroidal shape in FIG. 4a, but any shape which provides a closed path may be used. The current flowing in the conductor 430 creates a magnetic field in the core 426, with magnitude proportional to the current. A small gap in the core 426 contains a Hall Effect element 428. The Hall Effect element 428 produces a small signal proportional to the magnetic field passing through it. The small signal may be magnified by the amplifier 425 to produce the output signal 432. For an open-loop circuit, the output signal is generally a voltage, FIG. 4b shows a 2D side view 400b of the molded medium-voltage Hall Effect current sensor 200, as implemented with an open-loop circuit. FIG. 4c shows a 2D view 400c of section A-A of the same sensor 200, as implemented with an open-loop circuit. In both FIG. 4b and FIG. 4c, the molded case 402 is shown as transparent. A copper bar 430 carries the current to be measured, and is formed to create terminal 406 to receive the current and terminal 408 to deliver the current to the load. The terminals 406 and 408 may be provided with threaded holes for attaching bus bars or cables. The copper bar 430 may be bent or otherwise deformed so that any current flowing from terminal 406 to terminal 408 passes through a magnetic core 426, which is grounded to the box 404.

A small gap in the core 426 contains the Hall Effect element 428. The molding process may leave the gap exposed, so that the Hall Effect element 428 may be installed later. The Hall Effect element 428 may be connected to a printed circuit board 420, which contains the amplifier 425. The amplifier output signal 432 is connected to a terminal strip or output device 422 mounted at one end of the printed circuit board 420, near a removable access cover 416 and a hole 414 for a rigid or flexible conduit. Wires may be connected to the terminal strip or output device 422, and routed through the rigid or flexible conduit to reach the control circuits as shown in FIG. 3.

Figure 4D:
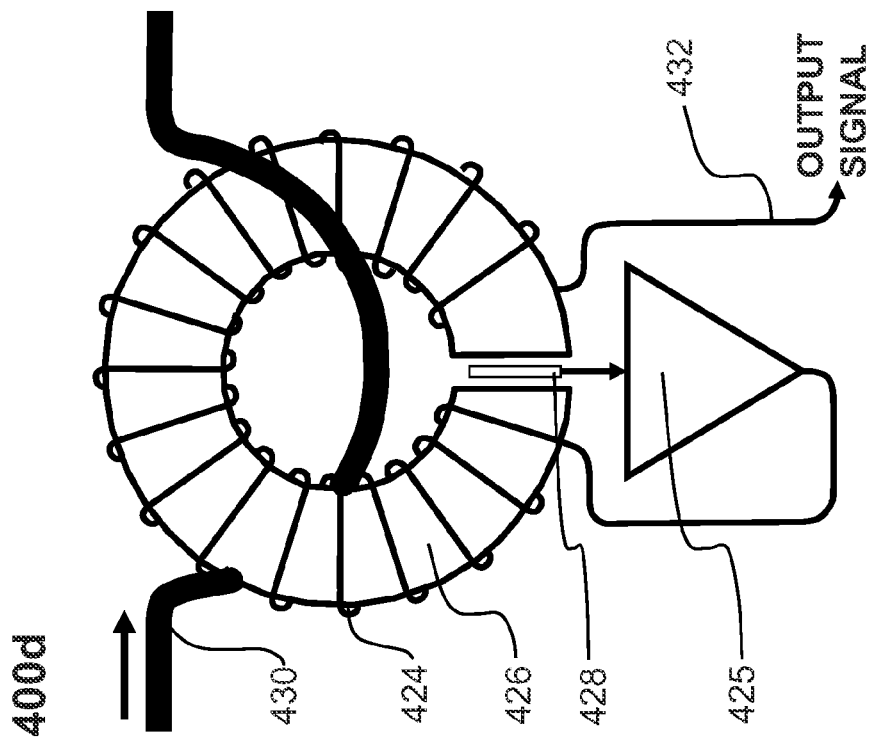
FIG. 4*d* illustrates a prior art block diagram of a closed-loop Hall Effect current sensor.

FIG. 4d shows a generalized prior art block diagram of a closed-loop Hall Effect current sensor circuit 400d. This closed-loop circuit 400d is similar to the open-loop circuit 400a. A heavy conductor 430 carrying the current to be measured may pass through the aperture of a magnetic core 426. The core 426 can be made of any material with high relative permeability, such as steel laminations or powdered iron or ferrite. The core 426 is shown with a toroidal shape in FIG. 4d, but any shape which provides a closed path may be used. The current flowing in the conductor 430 creates a magnetic field in the core 426. A small gap in the core 426 may contain a Hall Effect element 428. The Hall Effect element 428 produces a small signal proportional to the magnetic field passing through it. The small signal is magnified by the amplifier 425 to produce the output signal 432. For a closed-loop circuit, the output signal is a current. This current 432 is passed through a winding 424 on the core 426, in a direction opposite to the current in the conductor 430. By this means the magnitude of the magnetic field in the core 426 is kept near zero. This allows a smaller gap, a higher gain in the amplifier 425, and improves accuracy.

Figure 4E:
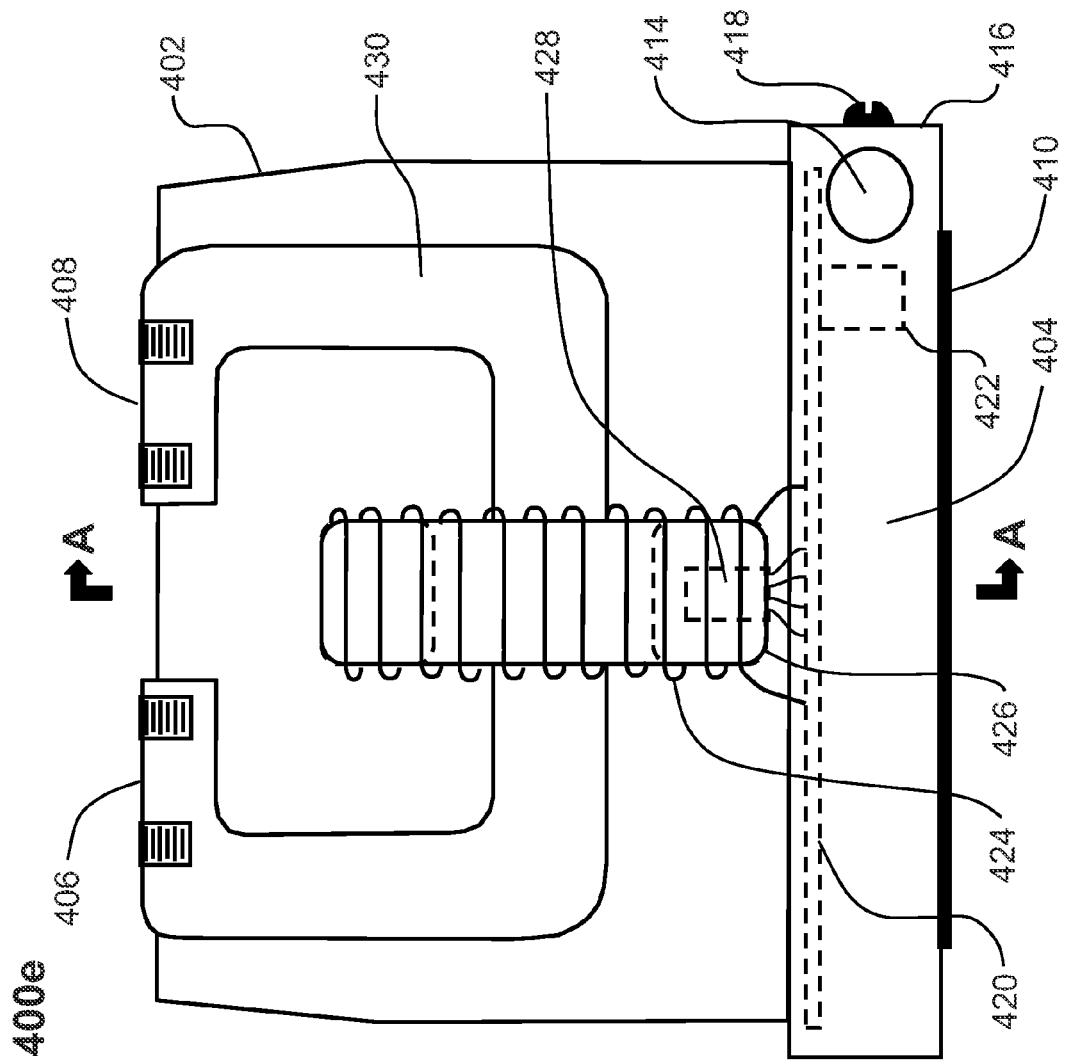
FIG. 4*e* shows an illustrative interior view showing how a closed-loop Hall Effect current sensor could be implemented in the embodiment shown in FIG. 2.
Figure 4F:
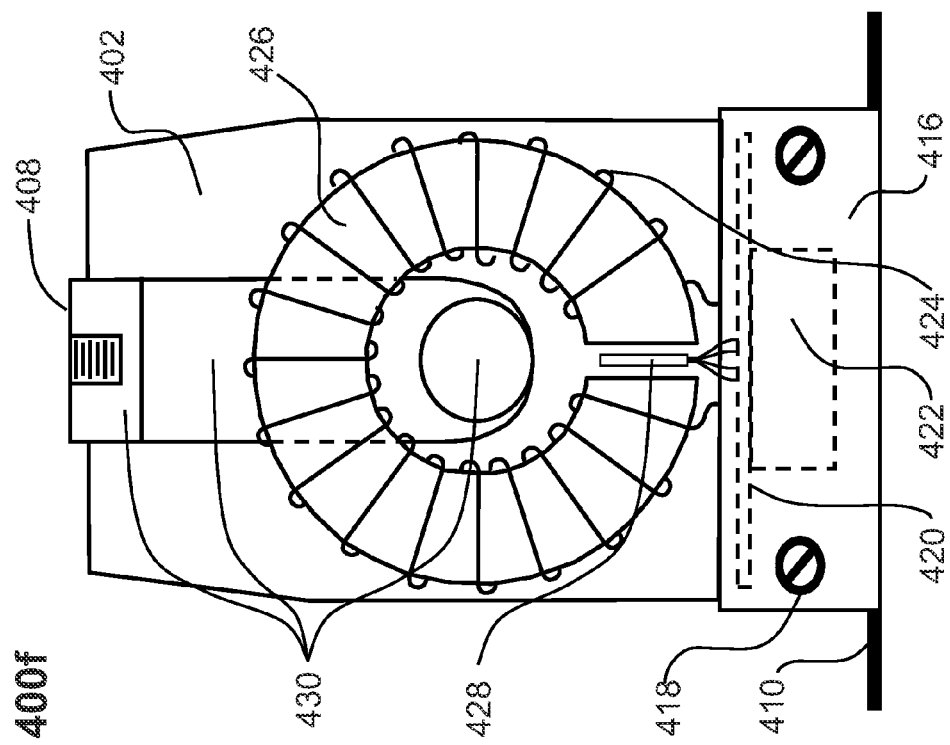
FIG. 4*f* illustrates a cross-section view of the configuration in FIG. 4*e*.

FIG. 4e shows a 2D side view 400e of the molded medium-voltage Hall Effect current sensor 200, as implemented with a closed-loop circuit. FIG. 4f shows a 2D view 400f of section A-A of the same sensor 200, as implemented with a closed-loop circuit. In both FIG. 4e and FIG. 4f, the molded case 402 is shown as transparent. A copper bar 430 carries the current to be measured, and is formed to create terminal 406 to receive the current and terminal 408 to deliver the current to the load. The terminals 406 and 408 may be provided with threaded holes for attaching bus bars or cables. The copper bar 430 may be bent or otherwise deformed so that any current flowing from terminal 406 to terminal 408 passes through a magnetic core 426, which is grounded to the box 404.

A small gap in the core 426 contains a Hall Effect element 428. The molding process may leave the gap exposed, so that the Hall Effect element 428 can be installed later. The Hall Effect element 428 may be connected to a printed circuit board 420, which contains the amplifier 425. The amplifier output signal 432 drives one end of the winding 424. The other end of winding 424 may be connected to a terminal strip or output device 422 mounted at one end of the printed circuit board 420, near a removable access cover 416 and a hole 414 for a rigid or flexible conduit. Wires may be be connected to the terminal strip or output device 422 and routed through the rigid or flexible conduit to reach the control circuits as shown in FIG. 3.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

What is claimed is:
1. A current sensor comprising:
an input terminal configured to receive a current;
an output terminal configured to transmit the current;
a closed core made from a magnetic material and comprising a gap;

at least one conductor operably connected to the input terminal and the output terminal and passing through the closed core, the at least one conductor sized to carry the current; and a molded case of solid dielectric material configured to completely encapsulate the closed core and the at least one conductor that connects the input terminal and the output terminal, wherein the gap, the input terminal and the output terminal are not encapsulated by the molded case, wherein the molded case is dimensioned such that internal and external spacings defined by the molded case are suitable for continuous operation with an AC voltage between the range of 1,000 volts and 69,000 volts as applied to the input terminal, the output terminal and the at least one conductor while the core is at ground potential.

2. The current sensor of claim 1, wherein the molded case comprises a first surface comprising a top surface and a second surface comprising a bottom surface, the first surface being parallel to and located opposite to the second surface, wherein the input terminal and the output terminal both project through the first surface and the gap is accessible through the second surface.

3. The current sensor of claim 2, wherein the second surface of the molded case is attached to a metal base comprising mounting provisions, wherein the metal base is electrically connected to the closed core, and the metal base together with the molded case provide mechanical support for one or more cables or bus-bars operably connected to the current sensor.

4. The current sensor of claim 3, wherein the metal base comprises a cavity through which the gap in the core is accessible such that when the metal base is mounted to a grounded metal surface, the base together with the grounded metal surface form a barrier between low-voltage circuits within the cavity and external medium-voltage circuits.

5. The current sensor of claim 4, wherein a printed circuit board is mounted in the cavity and a Hall Effect element operably connected to the printed circuit board projects at least partially into the gap, such that the Hall Effect element is not encapsulated by the molded case.

6. The current sensor of claim 5, wherein the printed circuit board comprises a connector for control wiring.

7. The current sensor of claim 6, wherein the metal base comprises:
 a removable panel for providing access to the connector; and
 an opening for connecting a conduit to the metal base.

8. A system comprising:
 a power supply;
 a load operably connected to the power supply; and
 at least one current sensor positioned between the power supply and the load, the current sensor comprising:
  an input terminal configured to receive a current,
  an output terminal configured to transmit the current,
  a closed core made from a magnetic material and comprising a gap;
  at least one conductor operably connected to the input terminal and the output terminal and passing through the closed core, the at least one conductor sized to carry the current, and
  a molded case of solid dielectric material configured to completely encapsulate the closed core and the at least one conductor that connects the input terminal and the output terminal, wherein the gap, the input terminal and the output terminal are not encapsulated by the molded case,
  wherein the molded case is dimensioned such that internal and external spacings defined by the molded case are suitable for continuous operation with an AC voltage between the range of 1,000 volts and 69,000 volts as applied to the input terminal, the output terminal and the at least one conductor while the core is at ground potential.

9. The system of claim 8, wherein the molded case comprises a first surface comprising a top surface and a second surface comprising a bottom surface, the first surface being parallel to and located opposite to the second surface, wherein the input terminal and the output terminal both project through the first surface and the gap is accessible through the second surface.

10. The system of claim 8, wherein the second surface of the molded case is attached to a metal base comprising mounting provisions, wherein the metal base is electrically connected to the closed core, and the metal base together with the molded case provide mechanical support for one or more cables or bus-bars connected to the at least one current sensor.

11. The system of claim 10, wherein the metal base comprises a cavity through which the gap in the core is accessible such that when the metal base is mounted to a grounded metal surface, the base together with the grounded metal surface form a barrier between low-voltage circuits within the cavity and external medium-voltage circuits.

12. The system of claim 11, wherein a printed circuit board is mounted in the cavity and a Hall Effect element operably connected to the printed circuit board projects at least partially into the gap, such that the Hall Effect element is not encapsulated by the molded case.

13. The system of claim 12, wherein the printed circuit board comprises a connector for control wiring.

14. The system of claim 13, wherein the metal base comprises:
 a removable panel for providing access to the connector; and
 an opening for connecting a conduit to the metal base.

* * * * *